United States Patent
Hsue et al.

(10) Patent No.: US 11,171,217 B1
(45) Date of Patent: Nov. 9, 2021

(54) MEMORY STRUCTURE AND MANUFACTURING METHOD THEREOF

(71) Applicant: Powerchip Semiconductor Manufacturing Corporation, Hsinchu (TW)

(72) Inventors: Chen-Chiu Hsue, Hsinchu (TW); Hsun-Kuei Chan, Hsinchu County (TW); Kai-An Hsueh, Miaoli County (TW); Ming-Te Huang, New Taipei (TW); Li-Tsen Jiang, Taoyuan (TW); Hung-Kwei Liao, Taoyuan (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 0 days.

(21) Appl. No.: 16/926,760

(22) Filed: Jul. 12, 2020

(30) Foreign Application Priority Data

May 8, 2020 (TW) ................................ 10911544.8

(51) Int. Cl.
*H01L 29/423* (2006.01)
*H01L 29/66* (2006.01)
(Continued)

(52) U.S. Cl.
CPC .. *H01L 29/42324* (2013.01); *H01L 21/02244* (2013.01); *H01L 21/32135* (2013.01);
(Continued)

(58) Field of Classification Search
CPC ......... H01L 29/42324; H01L 29/66825; H01L 29/7881; H01L 21/32135; H01L 21/02244; H01L 29/7833; H01L 27/11526; H01L 29/40114; H01L 21/32139; H01L 27/11521; H01L 29/66492

See application file for complete search history.

(56) References Cited

U.S. PATENT DOCUMENTS 6,537,880 B1 * 3/2003 Tseng ................ H01L 21/32139
438/260
6,653,188 B1 11/2003 Huang et al.
(Continued)

FOREIGN PATENT DOCUMENTS

CN 102956560 3/2013
CN 103579121 2/2014
(Continued)

OTHER PUBLICATIONS

Office Action of Taiwan Counterpart Application, dated May 13, 2021, pp. 1-5.

*Primary Examiner* — David Vu
(74) *Attorney, Agent, or Firm* — JCIPRNET

(57) ABSTRACT

A memory structure including a substrate, a charge storage layer, a first gate, a first dielectric layer, and a second dielectric layer is provided. The substrate includes a memory cell region. The charge storage layer is located on the substrate in the memory cell region. The charge storage layer has a recess. The charge storage layer has a tip around the recess. The first gate is located on the charge storage layer. The first dielectric layer is located between the charge storage layer and the substrate. The second dielectric layer is located between the first gate and the charge storage layer.

18 Claims, 19 Drawing Sheets

(51) Int. Cl.
*H01L 27/11526* (2017.01)
*H01L 27/11521* (2017.01)
*H01L 21/28* (2006.01)
*H01L 29/78* (2006.01)
*H01L 21/02* (2006.01)
*H01L 29/788* (2006.01)
*H01L 21/3213* (2006.01)

(52) U.S. Cl.
CPC .. *H01L 21/32139* (2013.01); *H01L 27/11521* (2013.01); *H01L 27/11526* (2013.01); *H01L 29/40114* (2019.08); *H01L 29/66492* (2013.01); *H01L 29/66825* (2013.01); *H01L 29/7833* (2013.01); *H01L 29/7881* (2013.01)

(56) References Cited

U.S. PATENT DOCUMENTS

| | | |
|---|---|---|
| 6,893,919 B2 | 5/2005 | Chuang et al. |
| 8,895,386 B2 | 11/2014 | Hsu et al. |
| 8,907,395 B2 | 12/2014 | Hsu et al. |
| 10,629,753 B2 * | 4/2020 | Kumar .............. H01L 29/40114 |

FOREIGN PATENT DOCUMENTS

| | | |
|---|---|---|
| TW | I485811 | 5/2015 |
| TW | I490982 | 7/2015 |
| TW | 201737472 | 10/2017 |
| TW | 201826547 | 7/2018 |
| TW | 201947744 | 12/2019 |

* cited by examiner

MEMORY STRUCTURE AND MANUFACTURING METHOD THEREOF

CROSS-REFERENCE TO RELATED APPLICATION

This application claims the priority benefits of Taiwan patent application serial no. 109115448, filed on May 8, 2020. The entirety of the above-mentioned patent application is hereby incorporated by reference here and made a part of this specification.

BACKGROUND

Field of the Disclosure

The disclosure relates to a semiconductor structure and a manufacturing method thereof, and particularly relates to a memory structure and a manufacturing method thereof.

Description of Related Art

With the advantage of being capable of undergoing multiple data storage, read, erase operations, and the stored data will not disappear when power is off, non-volatile memory device has become the memory device commonly adopted for personal computers and electronic apparatus. Therefore, how to further improve the electrical performance of the memory device is the goal currently pursued by the industry.

SUMMARY OF THE DISCLOSURE

The disclosure provides a memory structure and a manufacturing method thereof, which can improve the electrical performance of the memory device.

A memory structure including a substrate, a charge storage layer, a first gate, a first dielectric layer, and a second dielectric layer is provided. The substrate includes a memory cell region. The charge storage layer is located on the substrate in the memory cell region. The charge storage layer has a recess. The charge storage layer has a tip around the recess. The first gate is located on the charge storage layer. The first dielectric layer is located between the charge storage layer and the substrate. The second dielectric layer is located between the first gate and the charge storage layer.

According to an embodiment of the disclosure, in the memory structure, the shape of the tip in a top view may be a ring.

According to an embodiment of the disclosure, in the memory structure, the charge storage layer may include a first conductor layer and a second conductor layer. The second conductor layer is located on the top surface of the first conductor layer and surrounds the recess. The second conductor layer may have a tip.

According to an embodiment of the disclosure, in the memory structure, the width of the first conductor layer may be larger than the maximum width of the recess. The second conductor layer may have a uniform height.

According to an embodiment of the disclosure, the memory structure may further include a hard mask layer. The hard mask layer is located between the second dielectric layer and the charge storage layer. The hard mask layer can be filled in the recess.

According to an embodiment of the disclosure, in the memory structure, the width of the first gate may be larger than or equal to the width of the charge storage layer.

According to an embodiment of the disclosure, in the memory structure, a part of the first gate may be filled in the recess.

According to an embodiment of the disclosure, the memory structure may further include a second gate and a third dielectric layer. The second gate is located on the substrate in the memory cell region. The charge storage layer and the second gate may be derived from the same material layer. The third dielectric layer is located between the second gate and the substrate.

According to an embodiment of the disclosure, in the memory structure, the substrate may further include a peripheral circuit region. The memory structure may further include a third gate and a fourth dielectric layer. The third gate is located on the substrate in the peripheral circuit region. The charge storage layer and the third gate may be derived from the same material layer. The fourth dielectric layer is located between the third gate and the substrate.

The disclosure provides a manufacturing method of a memory structure, including the following steps. A substrate is provided. The substrate includes a memory cell region. A charge storage layer is formed on the substrate in the memory cell region. The charge storage layer has a recess. The charge storage layer has a tip around the recess. A first gate is formed on the charge storage layer. A first dielectric layer is formed between the charge storage layer and the substrate. A second dielectric layer is formed between the first gate and the charge storage layer.

According to an embodiment of the disclosure, in the manufacturing method of the memory structure, the method for forming the charge storage layer may include the following steps. A first conductor material layer is formed. A hard mask layer is formed on the first conductor material layer. The hard mask layer covers a part of the first conductor material layer in the memory cell region. A second conductor material layer is formed on the first conductor material layer and the hard mask layer. A dry etching process is performed to the second conductor material layer and the first conductor material layer to form the second conductor layer and the first conductor layer, and expose the hard mask layer. The second conductor layer is located on the top surface of the first conductor layer and surrounds the side wall of the hard mask layer. The second conductor layer may have a tip.

According to an embodiment of the disclosure, the manufacturing method of the memory structure may further include the following steps. After the charge storage layer is formed, the hard mask layer is removed.

According to an embodiment of the disclosure, in the manufacturing method of the memory structure, the method of removing the hard mask layer is, for example, a wet etching method.

According to an embodiment of the disclosure, in the manufacturing method of the memory structure, the method for forming the charge storage layer may include the following steps. A conductor material layer is formed. A local oxidation process is performed to the conductor material layer, and a hard mask layer is formed on the conductor material layer. The hard mask layer serves as the mask, and a part of the conductor material layer is removed.

According to an embodiment of the disclosure, in the manufacturing method of the memory structure, the method for forming the charge storage layer may include the following steps. The conductor layer is formed. A spacer is formed on the side wall of the conductor layer. An etch-back process is performed to the conductor layer.

According to an embodiment of the disclosure, in the manufacturing method of the memory structure, the etchback process is, for example, a dry etching process or a wet etching process.

According to an embodiment of the disclosure, the manufacturing method of the memory structure may further include the following steps. A pull back process is performed to the spacer.

According to an embodiment of the disclosure, in the manufacturing method of the memory structure, the pull back process is, for example, a dry etching process or a wet etching process.

According to an embodiment of the disclosure, the manufacturing method of the memory structure may further include the following steps. A second gate is formed on the substrate in the memory cell region. The charge storage layer and the second gate may be formed of the same material layer. A third dielectric layer is formed between the second gate and the substrate.

According to an embodiment of the disclosure, in the manufacturing method of the memory structure, the substrate may further include a peripheral circuit region. The manufacturing method of the memory structure may further include the following steps. A third gate is formed on the substrate in the peripheral circuit region. The charge storage layer and the third gate can be formed of the same material layer. A fourth dielectric layer is formed between the third gate and the substrate.

Based on the above, in the memory structure and the manufacturing method thereof provided by the disclosure, since the charge storage layer has a recess, and the charge storage layer has a tip around the recess, the memory device can be subjected to an erase operation by means of tip erase, thereby effectively reducing the erase voltage and improving the electrical performance of the memory device. In addition, since the erase operation and the programming operation of the memory structure can be performed through different paths, the write count and reliability of the memory device can be enhanced, and therefore the electrical performance of the memory device can be improved.

In order to make the features and advantages of the disclosure more comprehensible, the embodiments are specifically described in details below with reference to the accompanying drawings.

DESCRIPTION OF EMBODIMENTS

FIG. 1A to 1E are cross-sectional views of a manufacturing process of a memory structure according to an embodiment of the disclosure. FIG. 2 is a top view of the charge storage layer in FIG. 1B.

Figure 1A:
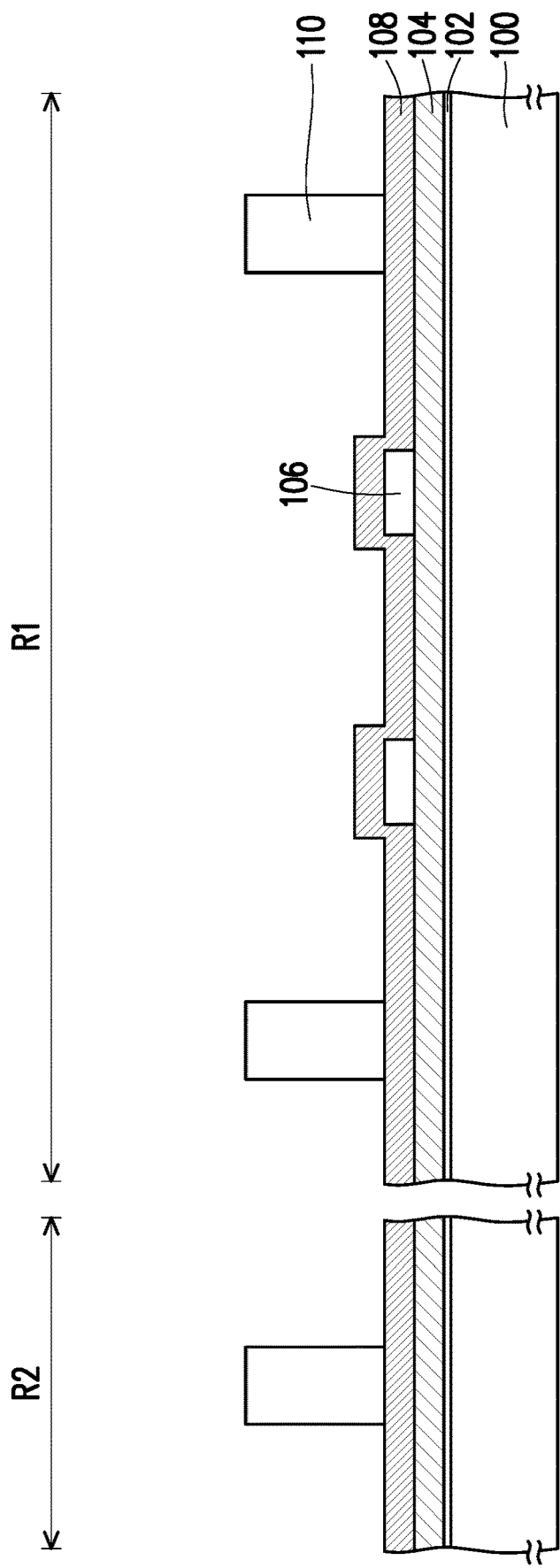
FIG. 1A to 1E are cross-sectional views of a manufacturing process of a memory structure according to an embodiment of the disclosure.
Figure 2:
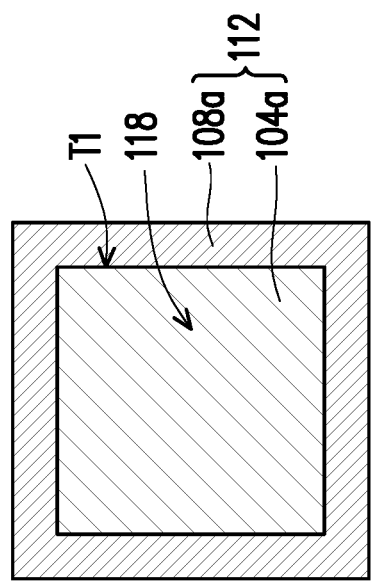
FIG. 2 is a top view of the charge storage layer in FIG. 1B.

Referring to FIG. 1A, a substrate 100 is provided. The substrate 100 may include a memory cell region R1. In addition, the substrate 100 may further include a peripheral circuit region R2. The substrate 100 may be a semiconductor substrate, such as a silicon substrate.

Next, a dielectric material layer 102 is formed on the substrate 100 in the memory cell region R1 and the peripheral circuit region R2. The material of the dielectric material layer 102 is, for example, silicon oxide. The method of forming the dielectric material layer 102 is, for example, a chemical vapor deposition method.

Then, a conductor material layer 104 is formed. The conductor material layer 104 may be formed on the dielectric material layer 102. The material of the conductor material layer 104 is, for example, doped polysilicon. The method of forming the conductor material layer 104 is, for example, a chemical vapor deposition method.

Next, a hard mask layer 106 is formed on the conductor material layer 104. The hard mask layer 106 covers a part of the conductor material layer 104 in the memory cell region R1. The hard mask layer 106 may be a single-layer structure or a multi-layer structure. The material of the hard mask layer 106 is, for example, silicon oxide, silicon nitride, silicon oxynitride, or a combination thereof. The method of forming the hard mask layer 106 may include the following steps. First, a hard mask material layer (not shown) can be formed by a deposition process. Next, the hard mask material layer is patterned by a lithography process and an etching process to form the hard mask layer 106.

Subsequently, a conductor material layer 108 is formed on the conductor material layer 104 and the hard mask layer 106. In addition, the conductor material layer 108 may be formed conformally on the hard mask layer 106. The material of the conductor material layer 108 is, for example, doped polysilicon. The method of forming the conductor material layer 108 is, for example, a chemical vapor deposition method.

Furthermore, a patterned photoresist layer 110 may be formed on the conductor material layer 108. The patterned photoresist layer 110 may cover a part of the conductor material layer 108. In addition, the patterned photoresist layer 110 may expose the conductor material layer 108 above the hard mask layer 106. The patterned photoresist layer 110 can be formed by a lithography process.

Figure 1B:
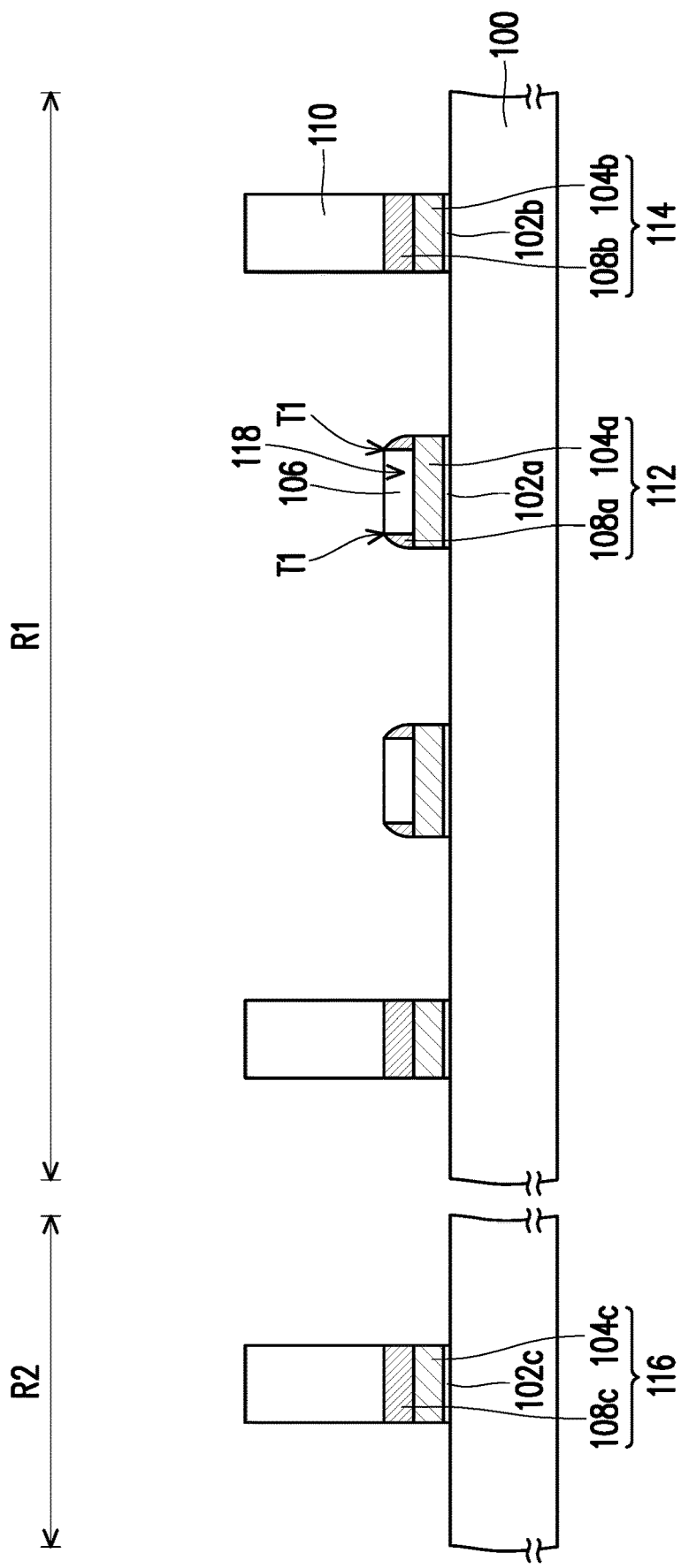

Referring to FIG. 1B, the conductor material layer 108 and the conductor material layer 104 are subjected to a dry etching process to form the conductor layer 108a and the conductor layer 104a, and the hard mask layer 106 is exposed. The conductor layer 108a is located on the top surface of the conductor layer 104a and surrounds the side wall of the hard mask layer 106. The conductor layer 108a may have a tip T1. In this embodiment, the charge storage layer 112 is not defined by the patterned photoresist layer 110, but is formed in a self-aligned manner. In addition, the patterned photoresist layer 110 can serve as a mask to perform a dry etching process to the conductor material layer 108 and the conductor material layer 104, so as to form the conductor layer 108b, the conductor layer 104b, the conductor layer 108c, and the conductor layer 104c.

In this manner, the charge storage layer 112 and the gate 114 can be formed on the substrate 100 in the memory cell region R1, and the gate 116 can be formed on the substrate 100 in the peripheral circuit region R2. The charge storage layer 112 may be a floating gate. The gate 114 can serve as a selection gate. The charge storage layer 112, the gate 114, and the gate 116 may be derived from the same material layer. That is, the charge storage layer 112, the gate 114, and the gate 116 may be formed of the same material layer. In other embodiments, the gate 114 and/or the gate 116 may be omitted.

The charge storage layer 112 has a recess 118. The charge storage layer 112 has a tip T1 around the recess 118. The charge storage layer 112 may include the conductor layer 104a and the conductor layer 108a. The conductor layer 108a is located on the top surface of the conductor layer 104a and surrounds the recess 118. The hard mask layer 106 may be located in the recess 118. The conductor layer 108a may have a tip T1. The width of the conductor layer 104a may be larger than the maximum width of the recess 118. The conductor layer 108a may have a uniform height. In addition, as shown in FIG. 2, the tip T1 may have a ring shape in a top view. In the embodiment of FIG. 2, the shape of the tip T1 in the top view is exemplified as a square ring, but the disclosure is not limited thereto. In other embodiments, the shape of the tip T1 in the top view may be a circular shape.

In addition, the gate 114 may include the conductor layer 104b and the conductor layer 108b. The conductor layer 108b is located on the conductor layer 104b. The gate 116 may include the conductor layer 104c and the conductor layer 108c. The conductor layer 108c is located on the conductor layer 104c.

Additionally, the dielectric material layer 102 not covered by the charge storage layer 112, the gate 114, and the gate 116 can be removed by an etching process, to form the dielectric layer 102a between the charge storage layer 112 and the substrate 100, to form the dielectric layer 102b between the gate 114 and the substrate 100, and to form the dielectric layer 102c between the gate 116 and the substrate 100. The above etching process is, for example, a dry etching process.

In the present embodiment, although the methods of forming the charge storage layer 112, the gate 114, the gate 116, and the dielectric layers 102a to 102c are exemplified as above, the disclosure is not limited thereto.

Figure 1C:
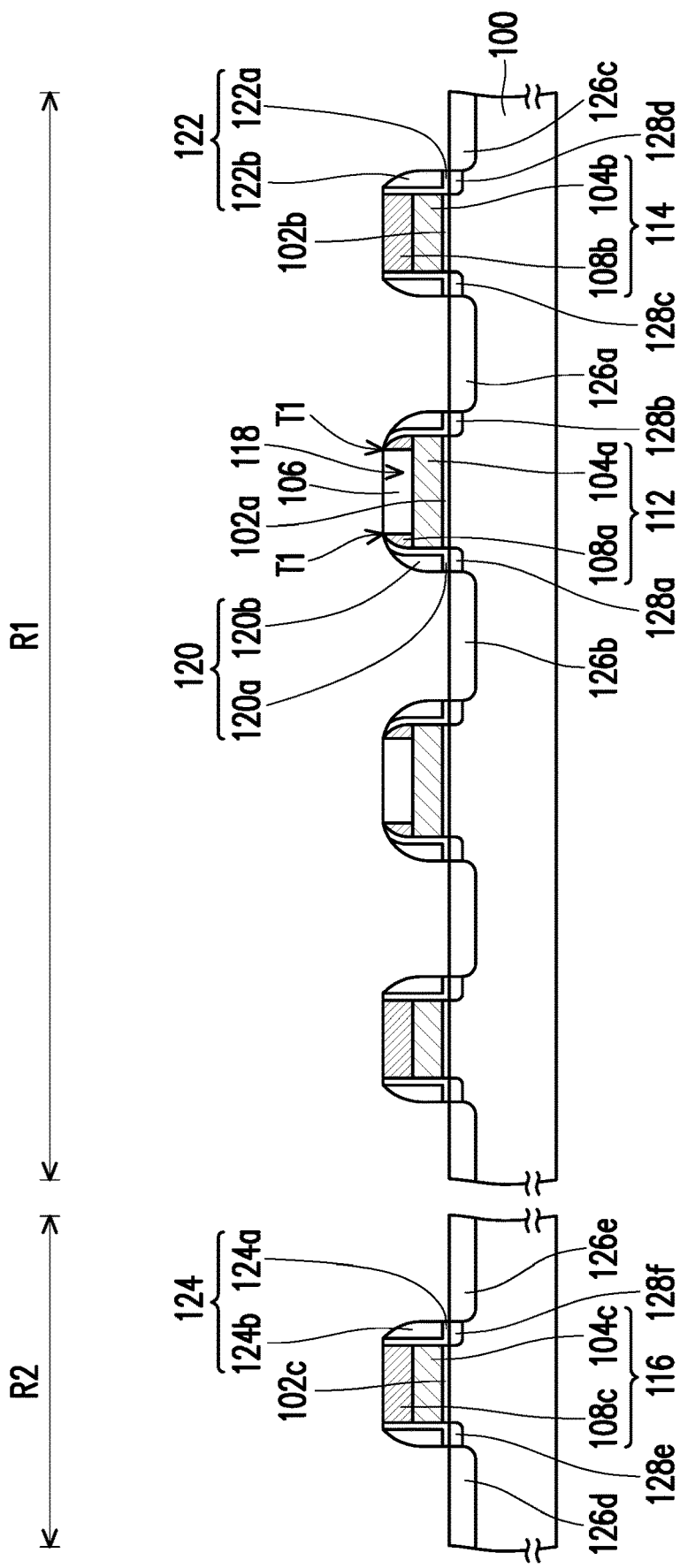

Referring to FIG. 1C, the patterned photoresist layer 110 is removed. The removal method of the patterned photoresist layer 110 is, for example, dry stripping or wet stripping.

In addition, the spacer 120, the spacer 122, and the spacer 124 may be formed on the side walls of the charge storage layer 112, the gate 114, and the gate 116, respectively. The spacer 120, the spacer 122, and the spacer 124 may be a single-layer structure or a multi-layer structure, respectively. For example, the spacer 120 may be a multi-layer structure including the spacer 120a and the spacer 120b, the spacer 122 may be a multi-layer structure including the spacer 122a and the spacer 122b, and the spacer 124 may be a multi-layer structure including the spacer 124a and the spacer 124b, but the disclosure is not limited thereto. The material of the spacer 120a, the spacer 122a and the spacer 124a is, for example, silicon oxide, and the material of the spacer 120b, the spacer 122b and the spacer 124b is, for example, silicon nitride, but the disclosure is not limited thereto.

In addition, doped regions 126a to 126e may be formed in the substrate 100. The doped regions 126a and 126b are located in the substrate 100 on both sides of the charge storage layer 112, the doped regions 126a and 126c are located in the substrate 100 on both sides of the gate 114, and the doped region 126a can be located between the charge storage layer 112 and the gate 114. The doped regions 126a to 126c may have the same conductivity type (e.g., N-type or P-type). The doped region 126d and the doped region 126e are located in the substrate 100 on both sides of the gate 116. The doped region 126d and the doped region 126e may have the same conductivity type (e.g., N-type or P-type). The doped regions 126a to 126c located in the memory cell region R1 and the doped regions 126d and 126e located in the peripheral circuit region R2 may have the same or different conductivity types.

Furthermore, lightly doped drains (LDD) 128a to 128f may be formed in the substrate 100. In some embodiments, "LDD" may also be referred to as "source/drain extension (SDE)" region. The lightly doped drain 128a and the lightly doped drain 128b are located in the substrate 100 below the spacer 120. The lightly doped drain 128c and the lightly doped drain 128d are located in the substrate 100 below the spacer 122. The lightly doped drain 128e and the lightly doped drain 128f are located in the substrate 100 below the spacer 124.

In addition, the spacer 120, the spacer 122, the spacer 124, the doped regions 126a to 126e and the lightly doped drains 128a to 128f can be formed by a method commonly known to those skilled in the art, the related description is not narrated herein.

Figure 1D:
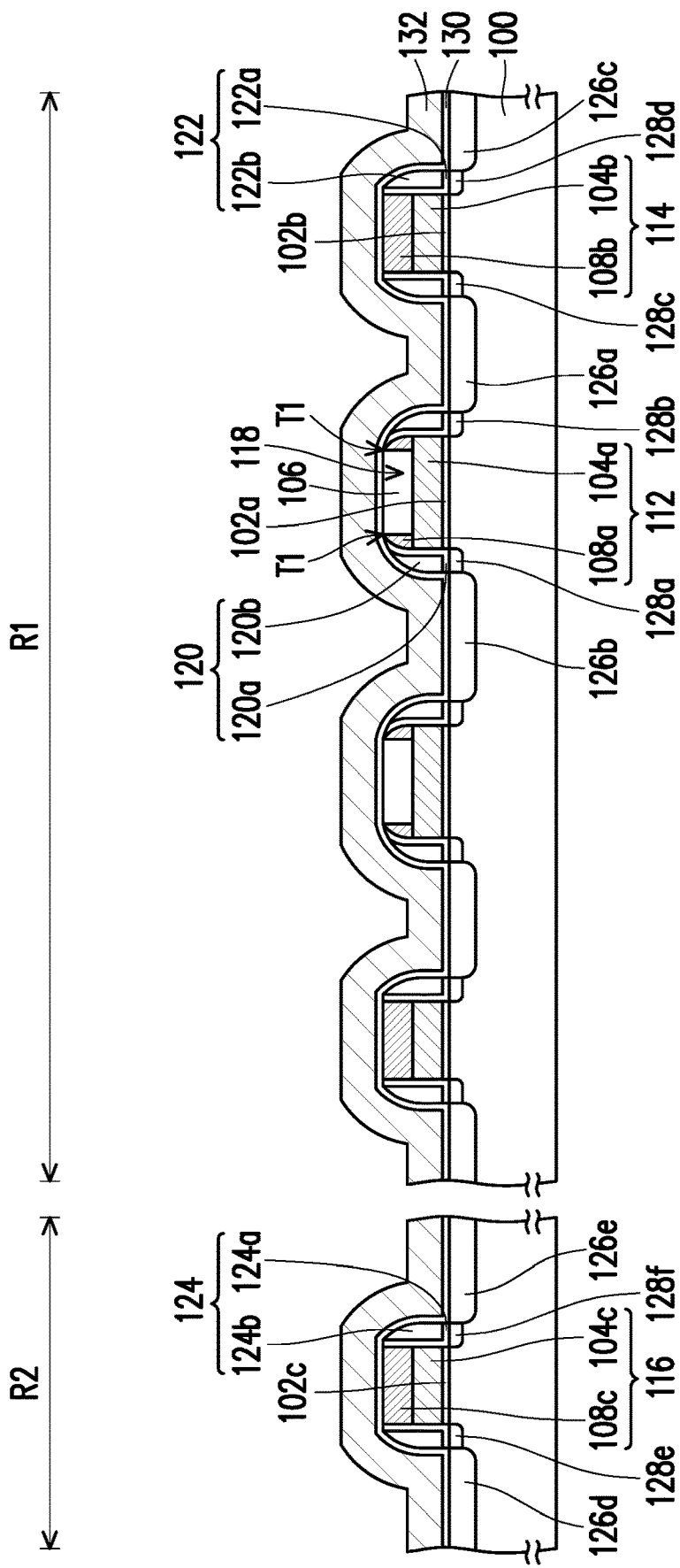

Referring to FIG. 1D, the dielectric material layer 130 may be formed on the charge storage layer 112, the gate 114, and the gate 116. In an embodiment, the dielectric material layer 130 may be a single-layer structure, such as a silicon oxide layer. In another embodiment, the dielectric material layer 114 may be a multi-layer structure, such as a composite layer of silicon oxide layer/silicon nitride layer/silicon oxide layer (ONO). The method of forming the silicon nitride layer is, for example, a chemical vapor deposition method. In addition, the method of forming the silicon oxide layer is, for example, a chemical vapor deposition method, a dry oxidation method, or a wet oxidation method.

Next, the conductor material layer 132 may be formed on the dielectric material layer 130. The material of the conductor material layer 132 is, for example, doped polysilicon. The method of forming the conductor material layer 116 is, for example, a chemical vapor deposition method.

Figure 1E:
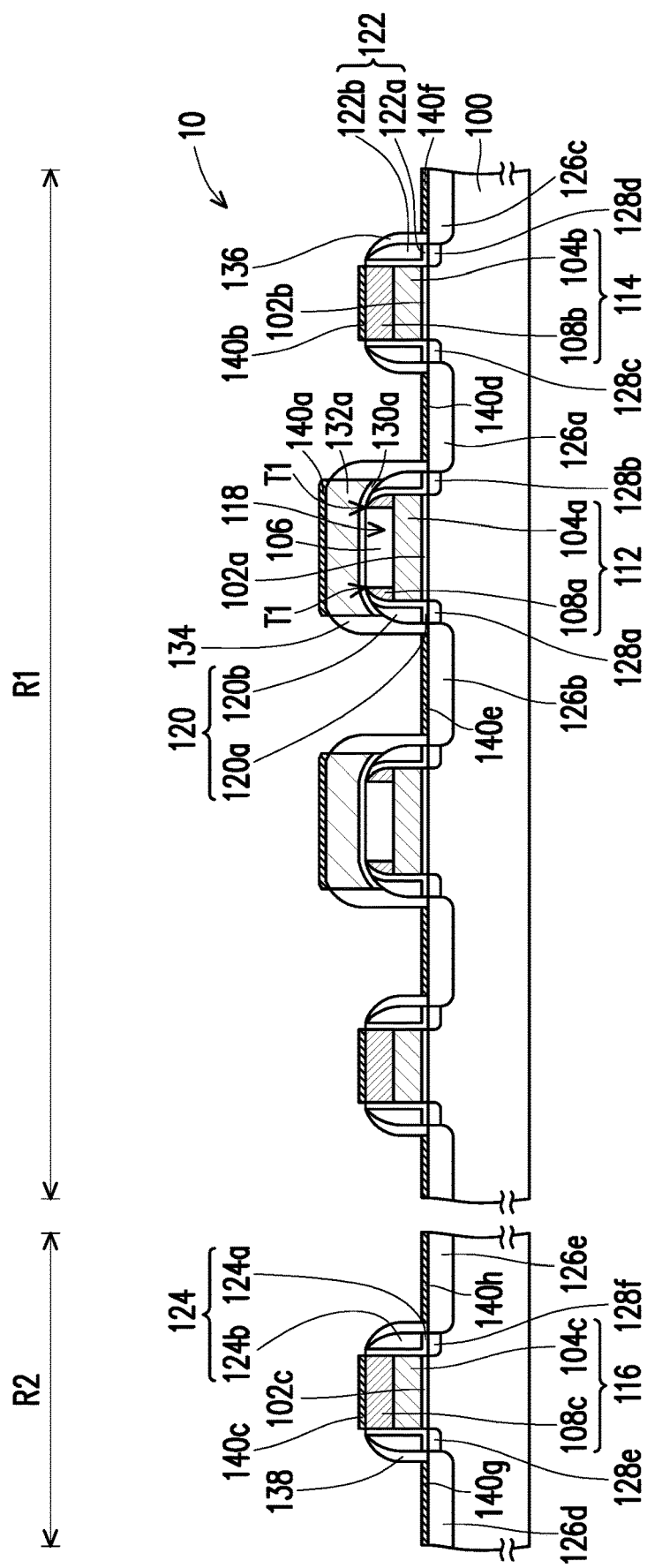

Referring to FIG. 1E, a patterning process is performed to the conductor material layer 132 and the dielectric material layer 130 by using a lithography process and an etching process. In this manner, the gate 132a can be formed on the charge storage layer 112, and the dielectric layer 130a can be formed between the gate 132a and the charge storage layer 112. The gate 132a can serve as a control gate or an erasing gate. The width of the gate 132a may be larger than or equal to the width of the charge storage layer 112. In this embodiment, the width of the gate 132a is exemplified as being larger than the width of the charge storage layer 112, but the disclosure is not limited thereto. In addition, although the methods for forming the dielectric layer 130a and the gate 132a are exemplified as above, the disclosure is not limited thereto.

Next, the spacer 134, the spacer 136, and the spacer 138 may be formed on the side wall of the gate 132a, the spacer 122 and the spacer 124, respectively. The spacer 134, the spacer 136, and the spacer 138 may be a single-layer structure or a multi-layer structure, respectively. The material of the spacer 134, the spacer 136, and the spacer 138 is, for example, silicon oxide, silicon nitride, or a combination thereof.

Then, metal silicide layers 140a to 140c may be formed on the top surface of the gate 132a, the top surface of the gate 114, and the top surface of the gate 116, respectively. In addition, metal silicide layers 140d to 140h may be formed on the surfaces of the doped regions 126a to 126e, respectively. The material of the metal silicide layers 140a to 140h is, for example, cobalt silicide or nickel silicide. The metal silicide layers 140a to 140h can be formed by a self-aligned silicide (salicide) process.

Hereinafter, the memory structure 10 in the embodiment will be described with reference to FIG. 1E. In this embodiment, in addition, although the method of forming the memory structure 10 is exemplified as above, the disclosure is not limited thereto.

Referring to FIG. 1E, the memory structure 10 includes the substrate 100, the charge storage layer 112, the gate 132a, the dielectric layer 102a, and the dielectric layer 130a. The memory structure 10 may further include at least one of the hard mask layer 106, the gate 114, the dielectric layer 102b, the gate 116, and the dielectric layer 102c. The substrate 100 includes the memory cell region R1, and may further include the peripheral circuit region R2. The charge storage layer 112 is located on the substrate 100 in the memory cell region R1. The charge storage layer 112 has the recess 118. The charge storage layer 112 has the tip T1 around the recess 118. The gate 132a is located on the charge storage layer 112. The dielectric layer 102a is located between the charge storage layer 112 and the substrate 100. The dielectric layer 130a is located between the gate 132a and the charge storage layer 112. The hard mask layer 106 is located between the dielectric layer 130a and the charge storage layer 112. The hard mask layer 106 may be filled in the recess 118. The gate 114 is located on the substrate 100 in the memory cell region R1. The dielectric layer 102b is located between the gate 114 and the substrate 100. The gate 116 is located on the substrate 100 in the peripheral circuit region R2. The dielectric layer 102c is located between the gate 116 and the substrate 100.

Additionally, for the rest of components in the memory structure 10, reference may be made to the description of the above embodiment. In addition, the materials, arrangement methods, conductivity types, forming methods, and effects of the components in the memory structure 10 have been described in detail in the foregoing embodiments, and will not be narrated here.

Based on the above embodiment, it can be obtained that in the memory structure 10 and the manufacturing method thereof, since the charge storage layer 112 has the recess 118, and the charge storage layer 112 has the tip T1 around the recess 118, the memory device can be subjected to the erase operation by means of tip erase, thereby effectively reducing the erase voltage and improving the electrical performance of the memory device. For example, a lower voltage (which may be lower than 14V, such as 11V) may be applied to the gate 132a, so that the electrons stored in the charge storage layer 112 pass through the dielectric layer 130a between the gate 132a and the charge storage layer 112 to enter the gate 132a, so as to achieve the erasing state. Furthermore, the erase operation and the programming operation of the memory structure 10 may be performed through different paths. For example, the path of tip erase may be that the electrons stored in the charge storage layer 112 pass through the dielectric layer 130a to enter the gate 132a, and the path of programming operation may be that the electrons pass through the dielectric layer 102a to be injected into the charge storage layer 112. In this manner, the durability of the dielectric layer 102a can be improved, and thus the write count and reliability of the memory device can be enhanced, and the electrical performance of the memory device can be improved.

Figure 3:
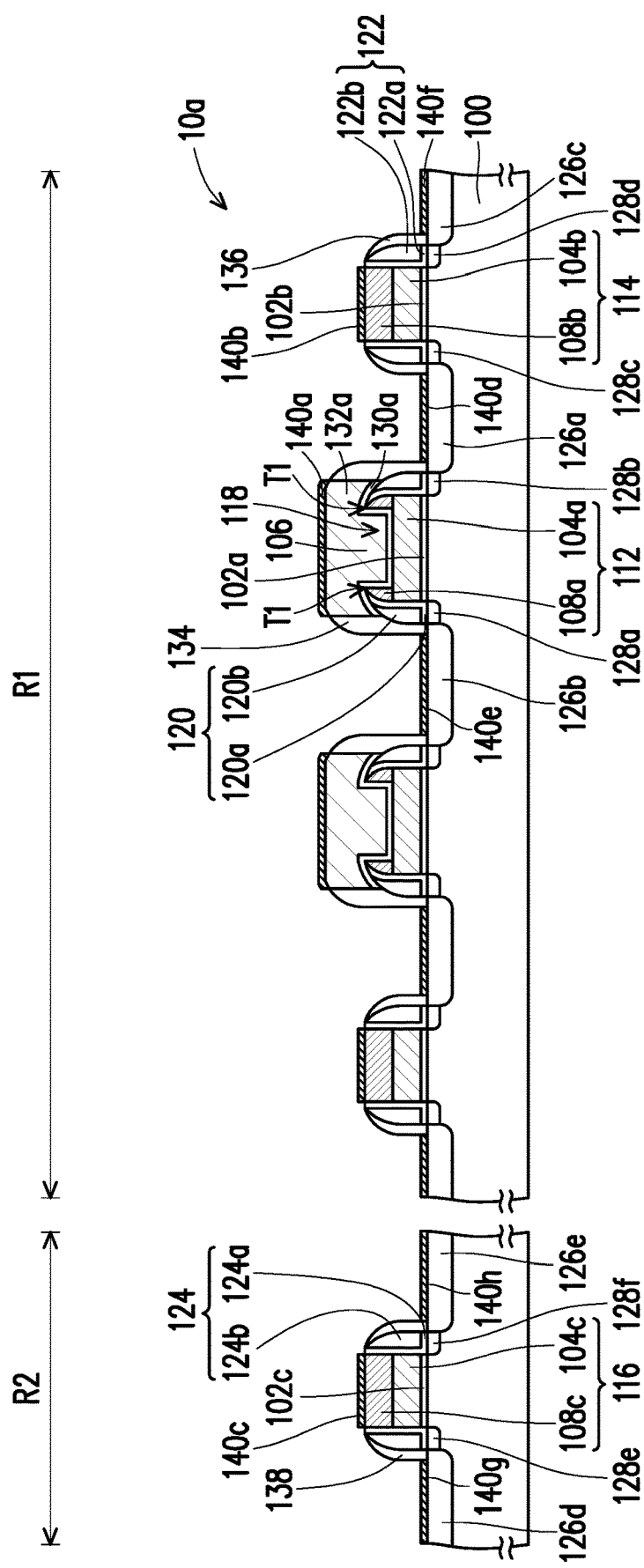
FIG. 3 is a cross-sectional view of a memory structure according to another embodiment of the disclosure.

FIG. 3 is a cross-sectional view of a memory structure according to another embodiment of the disclosure.

Please refer to FIG. 1E and FIG. 3, the difference between the memory structure 10a of FIG. 3 and the memory structure 10 of FIG. 1E is as follows. In the embodiment of FIG. 3, after the charge storage layer 112 is formed, the hard mask layer 106 may be removed. The method of removing the hard mask layer 106 is, for example, a wet etching method. In this manner, the subsequently formed gate 132a can be filled in the recess 118. Moreover, in the memory structure 10a and the memory structure 10, the same components are denoted by the same reference symbols, and the description thereof is not narrated here.

Based on the above embodiment, it can be obtained that, in the memory structure 10a and the manufacturing method thereof, since the charge storage layer 112 has the recess 118, and the charge storage layer 112 has the tip T1 around the recess 118, the memory device can be subjected to the erase operation by means of tip erase, thereby effectively reducing the erase voltage and improving the electrical performance of the memory device. In addition, since the erase operation and the programming operation of the memory structure 10a can be performed through different paths, the write count and reliability of the memory device can be enhanced, and therefore the electrical performance of the memory device can be improved.

FIG. 4A to FIG. 4D are cross-sectional views of a manufacturing process of a memory structure according to another embodiment of the disclosure. FIG. 5 is a top view of the charge storage layer in FIG. 4C.

Figure 4A:
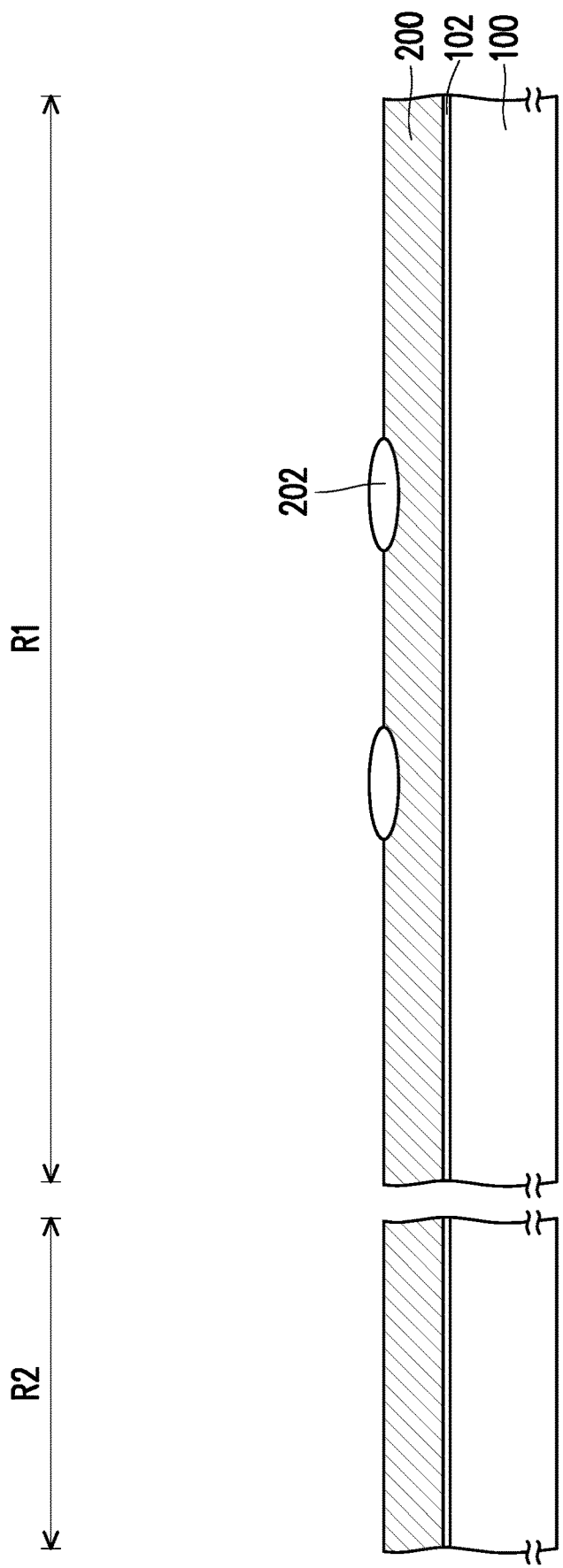
FIG. 4A to FIG. 4D are cross-sectional views of a manufacturing process of a memory structure according to another embodiment of the disclosure.
Figure 5:
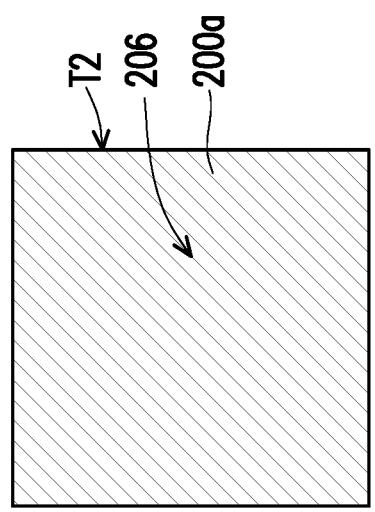
FIG. 5 is a top view of the charge storage layer in FIG. 4C.

Referring to FIG. 4A, the substrate 100 is provided. The substrate 100 may include the memory cell region R1, and may further include the peripheral circuit region R2. Next, the dielectric material layer 102 is formed on the substrate 100 in the memory cell region R1 and the peripheral circuit region R2. In addition, for details of the substrate 100 and the dielectric material layer 102, please refer to the description of FIG. 1A.

Next, the conductor material layer 200 is formed. The conductor material layer 200 may be formed on the dielectric material layer 102. The material of the conductor material layer 200 is, for example, doped polysilicon. The method of forming the conductor material layer 200 is, for example, a chemical vapor deposition method.

Then, a local oxidation process is performed to the conductor material layer 200, and the hard mask layer 202 is formed on the conductor material layer 200. The material of the hard mask layer 202 is, for example, silicon oxide.

Figure 4B:
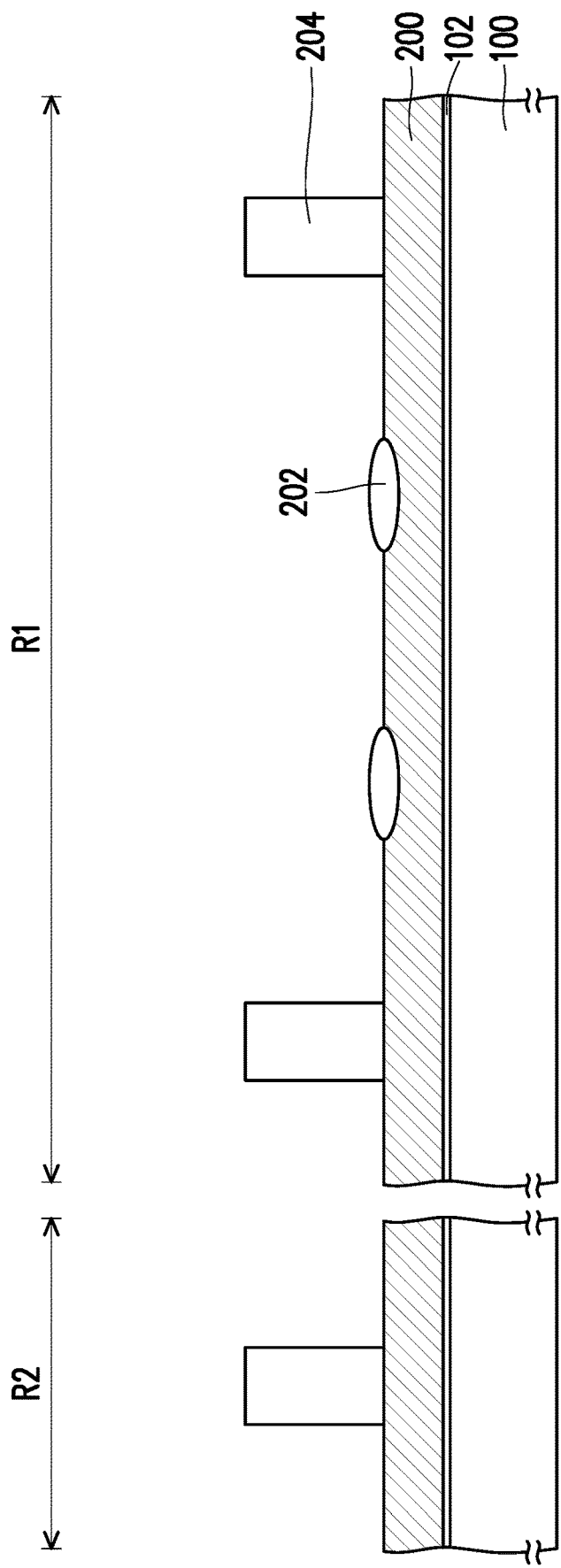

Referring to FIG. 4B, the patterned photoresist layer 204 may be formed on the conductor material layer 200. The patterned photoresist layer 204 may cover a part of the conductor material layer 200. In addition, the patterned photoresist layer 204 can expose the hard mask layer 202. The patterned photoresist layer 204 can be formed by a lithography process.

Figure 4C:
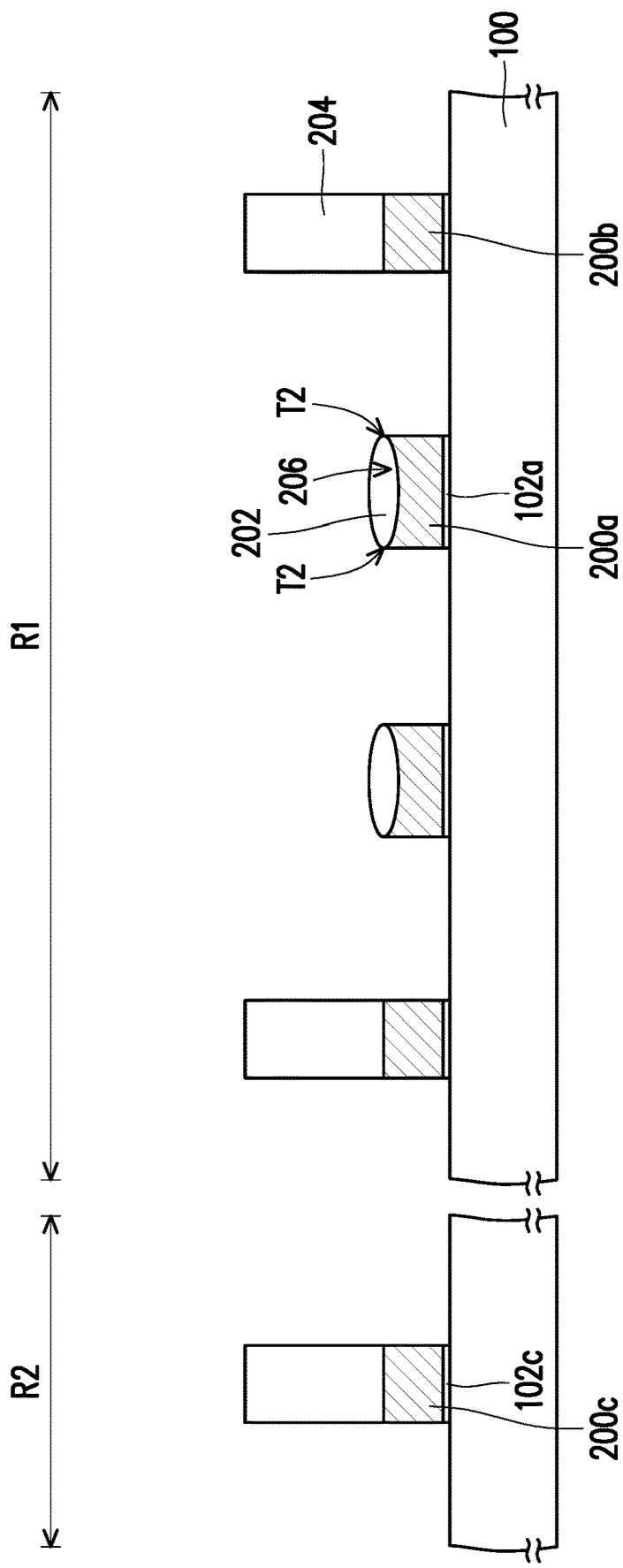

Please refer to FIG. 4C, the hard mask layer 106 is employed as a mask, a part of the conductor material layer 200 is removed, and the charge storage layer 200a is formed on the substrate 100 in the memory cell region R1. The charge storage layer 200a may be a floating gate. The method of removing a part of the conductor material layer 200 is, for example, a dry etching method. Moreover, the patterned photoresist layer 204 can serve as a mask to perform a dry etching process to the conductor material layer 200, so as to form the gate 200b on the substrate 100 in the memory cell region R1 and form the gate 200c on the substrate 100 in the peripheral circuit region R2. The gate 200b can serve as a selection gate. The charge storage layer 200a, the gate 200b, and the gate 200c may be derived from the same material layer. That is, the charge storage layer 200a, the gate 200b, and the gate 200c may be formed of the same material layer. In other embodiments, the gate 200b and/or the gate 200c may be omitted.

The charge storage layer 200a has the recess 206. The charge storage layer 200a has the tip T2 around the recess 206. The hard mask layer 202 can be located in the recess 206. In another embodiment, after forming the charge storage layer 200a, the hard mask layer 202 may be removed. The removal method of the hard mask layer 206 is, for example, a wet etching method. In this way, the subsequently formed gate 132a can be filled in the recess 206. Furthermore, as shown in FIG. 5, the tip T2 may have a ring shape in a top view. In the embodiment of FIG. 5, the shape of the tip T2 in the top view is exemplified as a square ring, but the disclosure is not limited thereto. In other embodiments, the shape of the tip T2 in the top view may be a circular shape.

In addition, the dielectric material layer 102 not covered by the charge storage layer 200a, the gate 200b, and the gate 200c can be removed by an etching process to form the dielectric layer 102a between the charge storage layer 200a and the substrate 100, to form the dielectric layer 102b between the gate 200b and the substrate 100, and to form the dielectric layer 102c between the gate 200c and the substrate 100. The above etching process is, for example, a dry etching process.

In the embodiment, although the methods of forming the charge storage layer 200a, the gate 200b, the gate 200c, and the dielectric layers 102a to 102c are exemplified as above, the disclosure is not limited thereto.

Figure 4D:
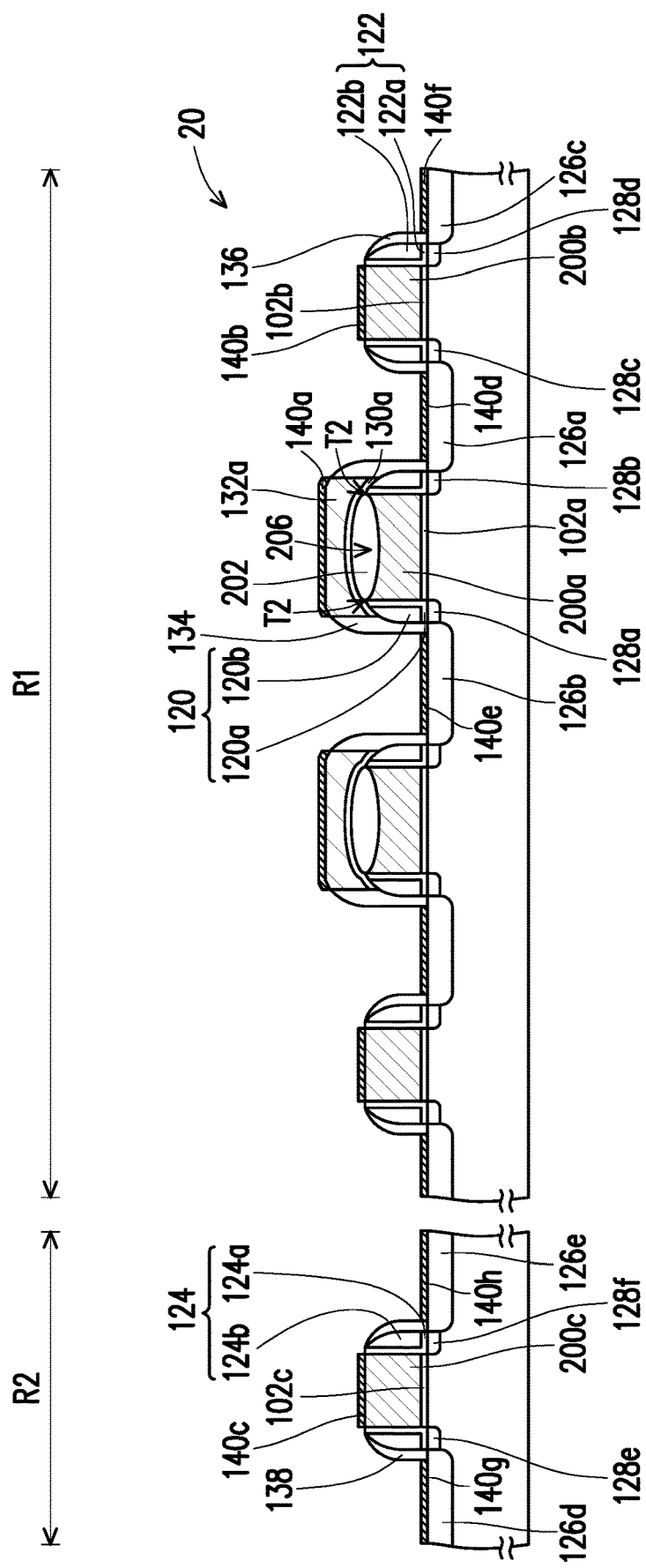

Referring to FIG. 4D, steps similar to FIG. 1C to FIG. 1E can be performed to form the memory structure 20. In addition, for the steps in FIG. 1C to FIG. 1E, please refer to the description of the above embodiment, and no further description is narrated here.

Hereinafter, the memory structure 20 in the embodiment will be described with reference to FIG. 4D. In this embodiment, although the method for forming the memory structure 20 is exemplified as above, the disclosure is not limited thereto.

Referring to FIG. 4D, the memory structure 20 includes the substrate 100, the charge storage layer 200a, the gate 132a, the dielectric layer 102a, and the dielectric layer 130a. The memory structure 20 may further include at least one of the hard mask layer 202, the gate 202b, the dielectric layer 102b, the gate 202c, and the dielectric layer 102c. The substrate 100 includes the memory cell region R1, and may further include the peripheral circuit region R2. The charge storage layer 200a is located on the substrate 100 in the memory cell region R1. The charge storage layer 200a has the recess 206. The charge storage layer 200a has the tip T2 around the recess 206. The gate 132a is located on the charge storage layer 200a. The dielectric layer 102a is located between the charge storage layer 200a and the substrate 100. The dielectric layer 130a is located between the gate 132a and the charge storage layer 200a. The hard mask layer 202 is located between the dielectric layer 130a and the charge storage layer 200a. The hard mask layer 202 can be filled in the recess 206. The gate 200b is located on the substrate 100 in the memory cell region R1. The dielectric layer 102b is located between the gate 200b and the substrate 100. The gate 200c is located on the substrate 100 in the peripheral circuit region R2. The dielectric layer 102c is located between the gate 200c and the substrate 100.

In addition, for the rest of components in the memory structure 20, reference may be made to the description of the above embodiment. In addition, the materials, arrangement methods, conductivity types, formation methods, and effects of the components in the memory structure 20 have been described in detail in the foregoing embodiments, and will not be described here.

Based on the above embodiment, it can be obtained that in the memory structure 20 and the manufacturing method thereof, since the charge storage layer 200a has the recess 206, and the charge storage layer 200a has the tip T2 around the recess 206, the memory device can be subjected to the erase operation by means of tip erase, thereby effectively reducing the erase voltage and improving the electrical performance of the memory device. In addition, since the erase operation and the programming operation of the memory structure 20 can be performed through different paths, the write count and reliability of the memory device can be enhanced, and therefore the electrical performance of the memory device can be improved.

FIG. 6A to FIG. 6F are cross-sectional views of a manufacturing process of a memory structure according to yet another embodiment of the disclosure. FIG. 7 is a top view of the charge storage layer in FIG. 6D.

Figure 6A:
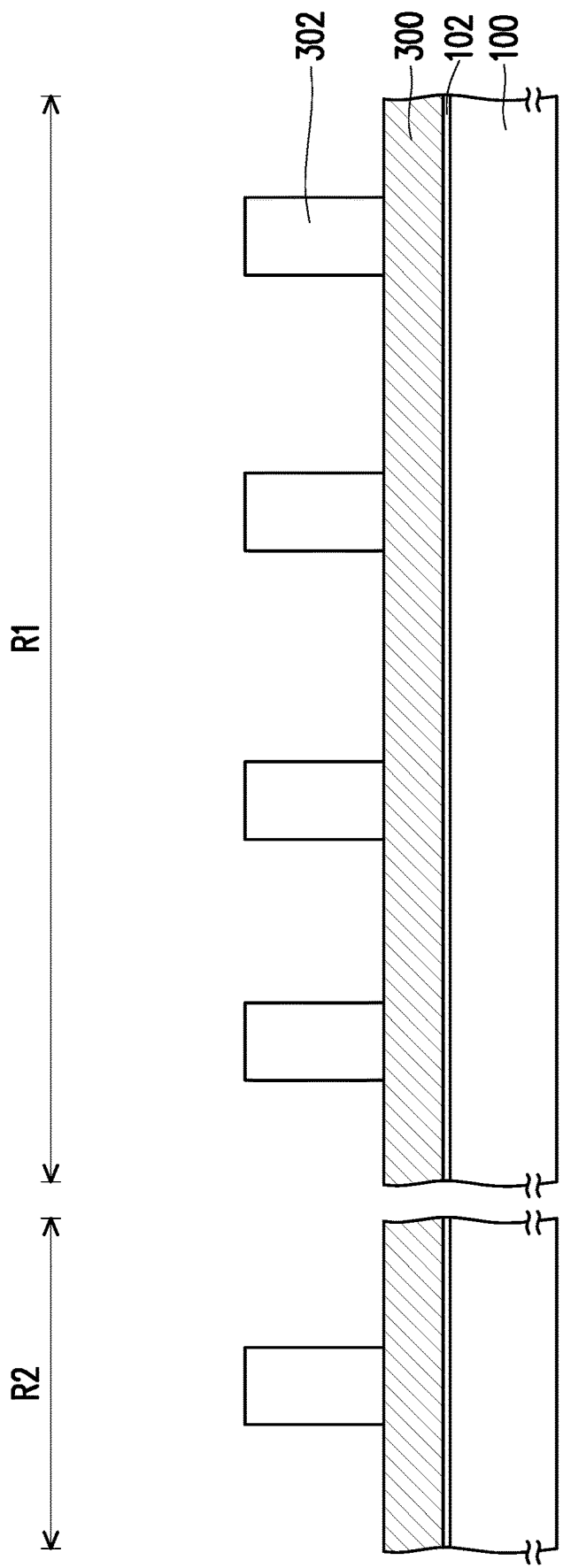
FIG. 6A to FIG. 6F are cross-sectional views of a manufacturing process of a memory structure according to yet another embodiment of the disclosure.
Figure 7:
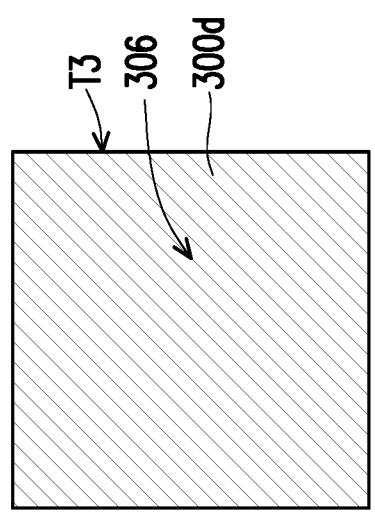
FIG. 7 is a top view of the charge storage layer in FIG. 6D.

Referring to FIG. 6A, the substrate 100 is provided. The substrate 100 may include the memory cell region R1, and may further include the peripheral circuit region R2. Next, the dielectric material layer 102 is formed on the substrate 100 in the memory cell region R1 and the peripheral circuit region R2. In addition, for details of the substrate 100 and the dielectric material layer 102, please refer to the description of FIG. 1A.

Next, the conductor material layer 300 is formed. The conductor material layer 300 may be formed on the dielectric material layer 102. The material of the conductor material layer 300 is, for example, doped polysilicon. The method of forming the conductor material layer 300 is, for example, a chemical vapor deposition method.

Then, the patterned photoresist layer 302 may be formed on the conductor material layer 300. The patterned photoresist layer 302 may cover a part of the conductor material layer 300. The patterned photoresist layer 302 can be formed by a lithography process.

Figure 6B:
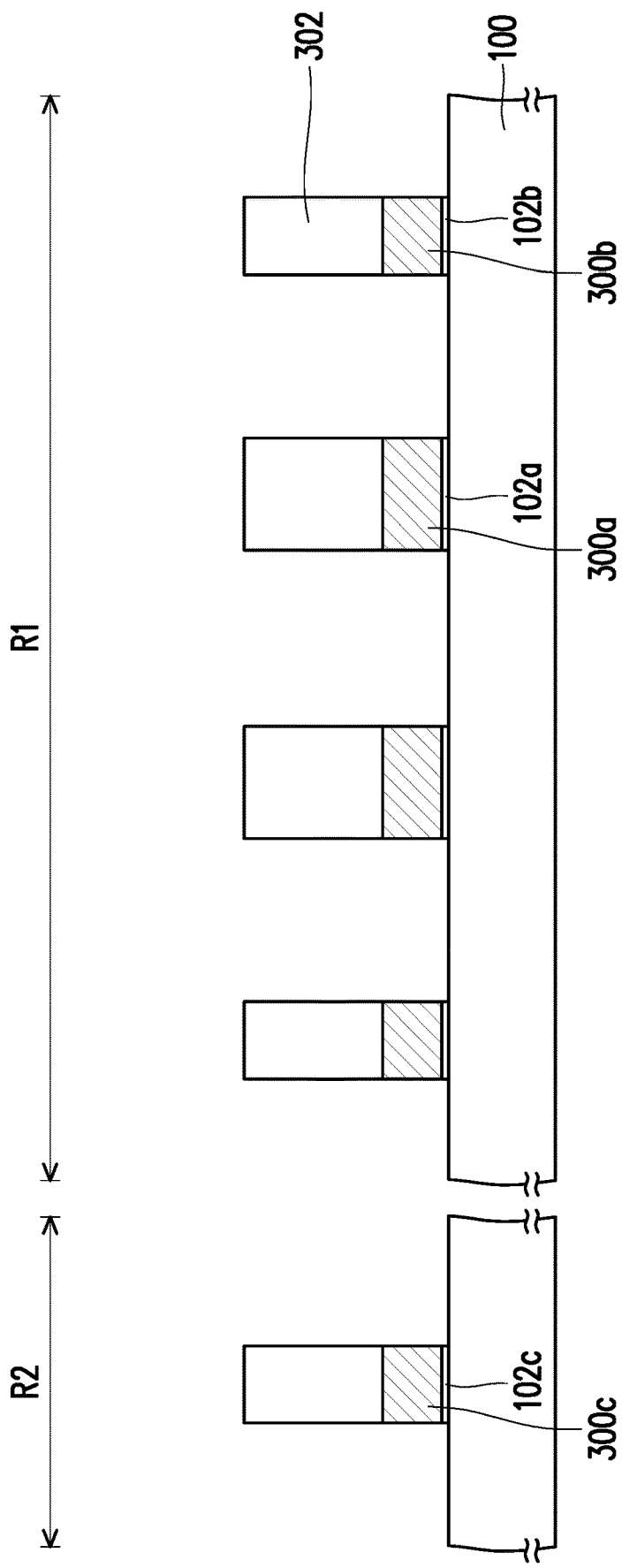

Please refer to FIG. 6B, the patterned photoresist layer 302 is employed as a mask, a part of the conductor material layer 300 is removed by a dry etching process, and the conductor layer 300a and the gate 300b are formed on the substrate 100 in the memory cell region R1, and the gate 300c is formed on the substrate 100 in the peripheral circuit region R2. The gate 300b can serve as a selection gate. In other embodiments, the gate 300b and/or the gate 300c may be omitted.

In addition, the dielectric material layer 102 not covered by the conductor layer 300a, the gate 300b and the gate 300c can be removed by an etching process to form the dielectric layer 102a between the conductor layer 300a and the substrate 100, to form the dielectric layer 102b between the gate 300b and the substrate 100, and to form the dielectric layer 102c between the gate 300c and the substrate 100. The above etching process is, for example, a dry etching process.

In this embodiment, although the methods of forming the conductor layer 300a, the gate 300b and the gate 300c, and the dielectric layers 102a to 102c are exemplified as above, the disclosure is not limited thereto.

Figure 6C:
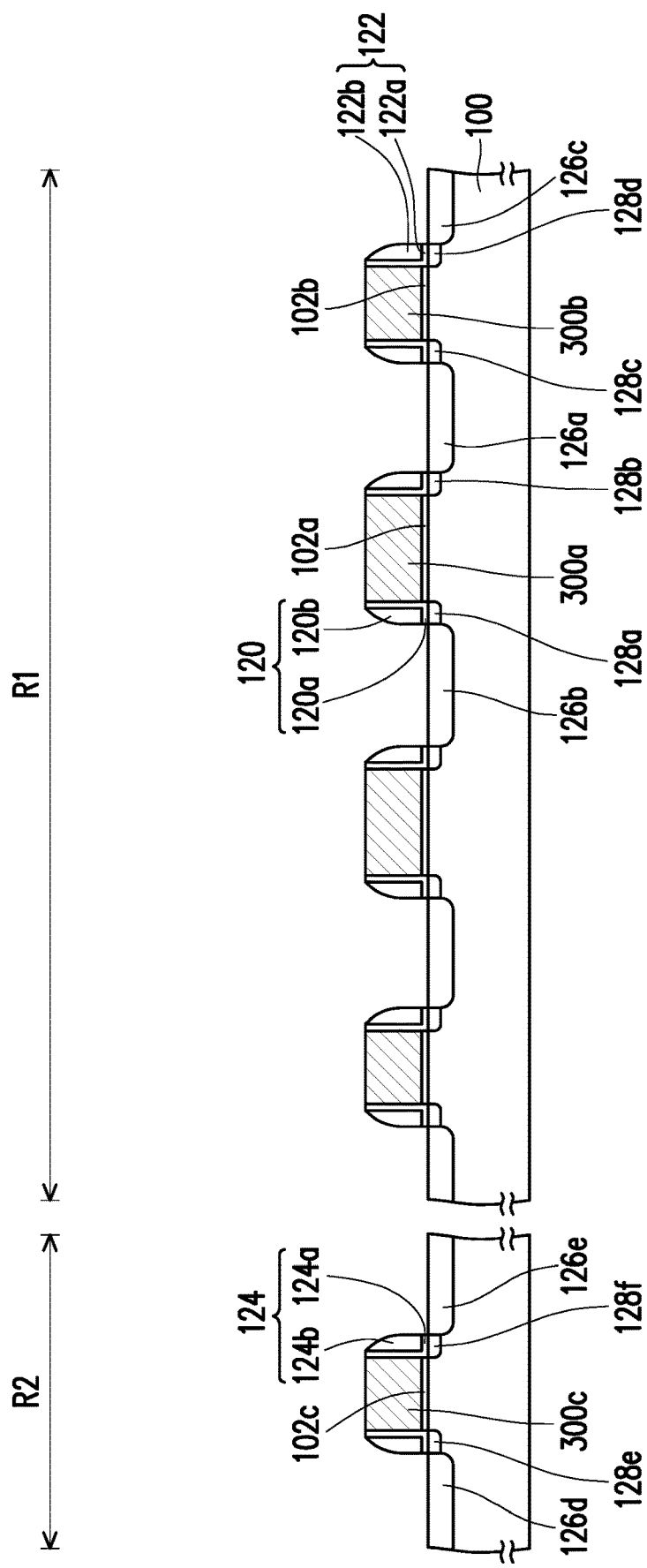

Referring to FIG. 6C, steps similar to those in FIG. 1C may be performed to remove the patterned photoresist layer 302, and form the spacer 120, the spacer 122, the spacer 124, the doped regions 126a to 126e and the lightly doped drains 128a to 128f. In this way, the spacer 120 can be formed on the side wall of the conductor layer 300a. In addition, for details of the spacer 120, the spacer 122, the spacer 124, the doped regions 126a to 126e and the lightly doped drains 128a to 128f, please refer to the description of FIG. 1C, and no further description is narrated here.

Figure 6D:
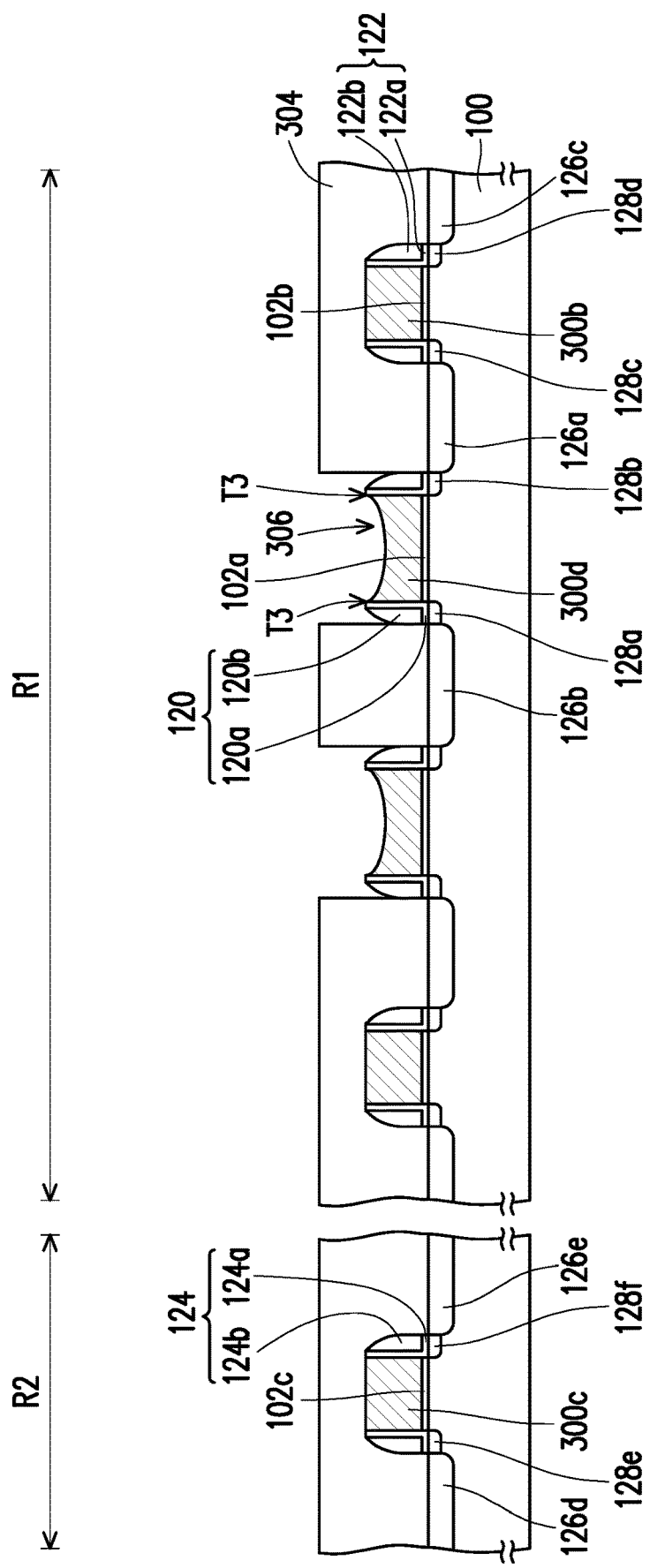

Referring to FIG. 6D, the patterned photoresist layer 304 exposing the conductor layer 300a may be formed. The patterned photoresist layer 304 can be formed by a lithography process.

Next, the conductor layer 300a is subjected to an etch-back process to form the charge storage layer 300d on the substrate 100 in the memory cell region R1. The charge storage layer 300d has the recess 306. The charge storage layer 300d has the tip T3 around the recess 306. The charge storage layer 300d may be a floating gate. In addition, as shown in FIG. 7, the tip T3 may have a ring shape in a top view. In the embodiment of FIG. 7, the shape of the tip T3 in the top view is exemplified as a square ring, but the disclosure is not limited thereto. In other embodiments, the shape of the tip T3 in the top view may be a circular shape. The charge storage layer 300d, the gate 300b, and the gate 300c may be derived from the same material layer. That is, the charge storage layer 300d, the gate 300b, and the gate 300c may be formed of the same material layer. The etch-back process is, for example, a dry etching process or a wet etching process.

Figure 6E:
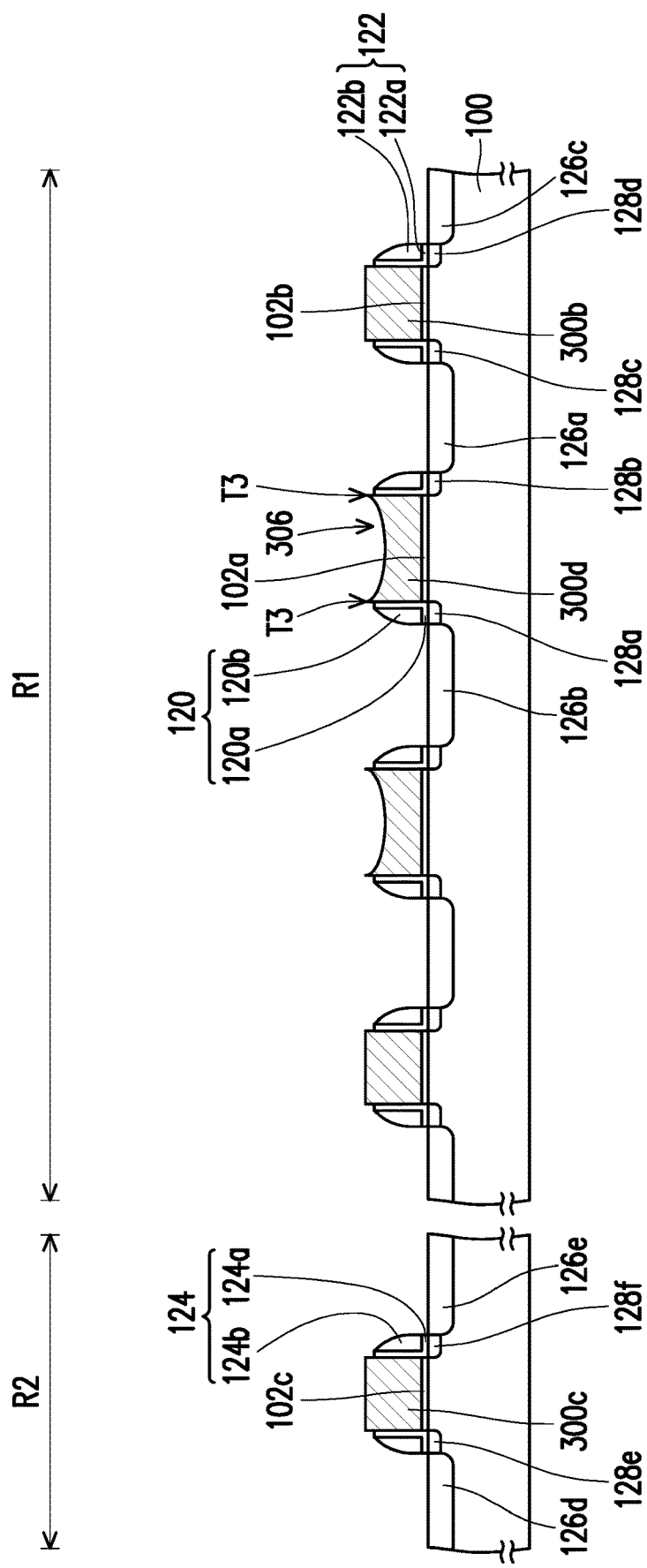

Referring to FIG. 6E, the patterned photoresist layer 304 is removed. The removal method of the patterned photoresist layer 304 is, for example, a dry photoresist removal method or a wet photoresist removal method.

Next, the spacer 120, the spacer 122, and the spacer 124 may be subjected to a pull back process to remove a part of the spacer 120, the spacer 122, and the spacer 124, so that the tip T3 of the charge storage layer 300d is higher than the spacer 120, and the top surfaces of the gate 300b and the gate 300c are configured to be higher than the spacer 122 and the spacer 124, respectively. The pull back process is, for example, a dry etching process or a wet etching process.

Figure 6F:
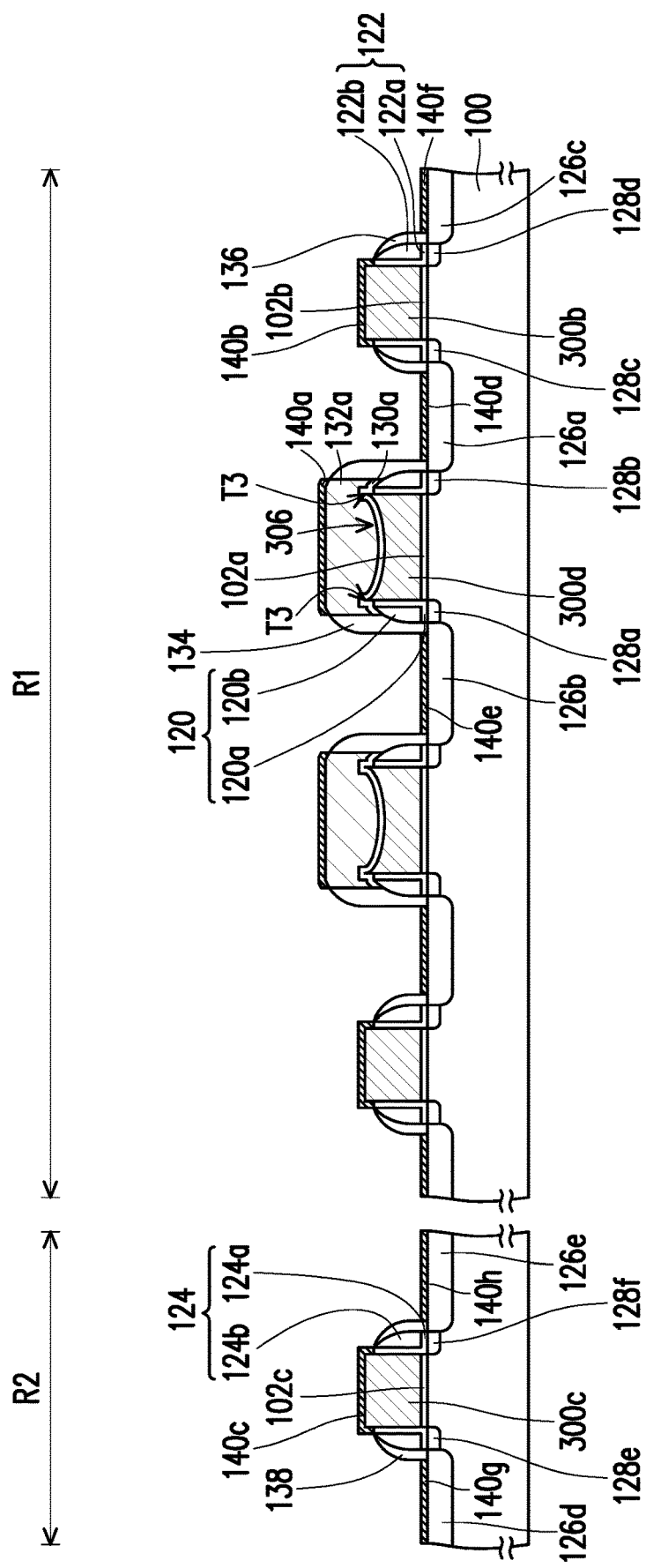

Referring to FIG. 6F, steps similar to those in FIG. 1D and FIG. 1E can be performed to form the dielectric layer 130a, the gate 132a, the spacer 134, the spacer 136, the spacer 138, and metal silicide layers 140a to 140h. The gate 132a may be filled in the recess 306. In addition, for details of the dielectric layer 130a, the gate 132a, the spacer 134, the spacer 136, and the spacer 138, please refer to the descriptions of FIG. 1D and FIG. 1E, and related descriptions will be not narrated here.

Hereinafter, the memory structure 30 of the embodiment will be described with reference to FIG. 6F. In this embodiment, in addition, although the method of forming the memory structure 30 is exemplified as above, the disclosure is not limited thereto.

Referring to FIG. 6F, the memory structure 30 includes the substrate 100, the charge storage layer 300d, the gate 132a, the dielectric layer 102a, and the dielectric layer 130a. The memory structure 30 may further include at least one of the gate 300b, the dielectric layer 102b, the gate 300c, and the dielectric layer 102c. The substrate 100 includes the memory cell region R1, and may further include the peripheral circuit region R2. The charge storage layer 300d is located on the substrate 100 in the memory cell region R1. The charge storage layer 300d has the recess 306. The charge storage layer 300d has the tip T3 around the recess 306. The gate 132a is located on the charge storage layer 300d. The dielectric layer 102a is located between the charge storage layer 300d and the substrate 100. The dielectric layer 130a is located between the gate 132a and the charge storage layer 300d. The gate 300b is located on the substrate 100 in the memory cell region R1. The dielectric layer 102b is located between the gate 300b and the substrate 100. The gate 300c is located on the substrate 100 in the peripheral circuit region R2. The dielectric layer 102c is located between the gate 300c and the substrate 100.

In addition, for the rest of components in the memory structure 30, reference may be made to the description of the above embodiment. In addition, the materials, arrangement methods, conductivity types, forming methods, and effects of the components in the memory structure 30 have been described in detail in the foregoing embodiments, and will not be described here.

Based on the above embodiment, it can be obtained that in the memory structure 30 and the manufacturing method thereof, since the charge storage layer 300d has the recess 306, and the charge storage layer 300d has the tip T3 around the recess 306, the memory device can be subjected to the erase operation by means of tip erase, thereby effectively reducing the erase voltage and improving the electrical performance of the memory device. In addition, since the erase operation and the programming operation of the memory structure 30 can be performed through different paths, the write count and reliability of the memory device can be enhanced, and therefore the electrical performance of the memory device can be improved.

In summary, the memory structure and the manufacturing method thereof described in the above embodiment can effectively reduce the erase voltage, and can improve the write count and reliability of the memory device, thereby enhancing the electrical performance of the memory device.

Although the disclosure has been disclosed in the above embodiments, it is not intended to limit the disclosure, and those skilled in the art can make some modifications and refinements without departing from the spirit and scope of the disclosure. Therefore, the scope of the disclosure is subject to the definition of the scope of the appended claims.

What is claimed is:

1. A memory structure, comprising:
    a substrate, comprising a memory cell region;
    a charge storage layer located on the substrate in the memory cell region, wherein the charge storage layer has a recess, and the charge storage layer has a tip around the recess;
    a first gate located on the charge storage layer;
    a first dielectric layer located between the charge storage layer and the substrate; and
    a second dielectric layer located between the first gate and the charge storage layer, wherein
    the substrate further comprises a peripheral circuit region, and the memory structure further comprises:
    a third gate located on the substrate in the peripheral circuit region, wherein the charge storage layer and the third gate are derived from the same material layer; and
    a fourth dielectric layer located between the third gate and the substrate.

2. The memory structure according to claim 1, wherein a shape of the tip in a top view comprises a ring shape.

3. The memory structure according to claim 1, wherein the charge storage layer comprises:
    a first conductor layer; and
    a second conductor layer located on a top surface of the first conductor layer and surrounds the recess, wherein the second conductor layer has the tip.

4. The memory structure according to claim 3, wherein a width of the first conductor layer is larger than a maximum width of the recess, and the second conductor layer has a uniform height.

5. The memory structure according to claim 1, further comprising:
a hard mask layer located between the second dielectric layer and the charge storage layer, and filled in the recess.

6. The memory structure according to claim 1, wherein a width of the first gate is larger than or equal to a width of the charge storage layer.

7. The memory structure according to claim 1, wherein a part of the first gate is filled in the recess.

8. The memory structure according to claim 1, further comprising:
a second gate located on the substrate in the memory cell region, wherein the charge storage layer and the second gate are derived from the same material layer; and
a third dielectric layer located between the second gate and the substrate.

9. A manufacturing method of a memory structure, comprising:
providing a substrate, wherein the substrate comprises a memory cell region;
forming a charge storage layer on the substrate in the memory cell region, wherein the charge storage layer has a recess, and the charge storage layer has a tip around the recess;
forming a first gate on the charge storage layer;
forming a first dielectric layer between the charge storage layer and the substrate; and
forming a second dielectric layer between the first gate and the charge storage layer, wherein
the substrate further comprises a peripheral circuit region, and the manufacturing method of the memory structure further comprises:
forming a third gate on the substrate in the peripheral circuit region, wherein the charge storage layer and the third gate are formed of the same material layer; and
forming a fourth dielectric layer between the third gate and the substrate.

10. The manufacturing method of the memory structure according to claim 9, wherein a method for forming the charge storage layer comprises:
forming a first conductor material layer;
forming a hard mask layer on the first conductor material layer, wherein the hard mask layer covers a part of the first conductor material layer in the memory cell region;
forming a second conductor material layer on the first conductor material layer and the hard mask layer; and
performing a dry etching process to the second conductor material layer and the first conductor material layer to form a second conductor layer and a first conductor layer, and exposes the hard mask layer, wherein the second conductor layer is located on a top surface of the first conductor layer and surrounds a side wall of the hard mask layer, and the second conductor layer has the tip.

11. The manufacturing method of the memory structure according to claim 10, further comprising:
removing the hard mask layer after forming the charge storage layer.

12. The manufacturing method of the memory structure according to claim 11, wherein a method for removing the hard mask layer comprises a wet etching method.

13. The manufacturing method of the memory structure according to claim 9, wherein a method for forming the charge storage layer comprises:
forming a conductor material layer;
performing a local oxidation process to the conductor material layer to form a hard mask layer on the conductor material layer; and
using the hard mask layer as a mask to remove a part of the conductor material layer.

14. The manufacturing method of the memory structure according to claim 9, wherein a method for forming the charge storage layer comprises:
forming a conductor layer;
forming a spacer on a side wall of the conductor layer; and
performing an etch-back process to the conductor layer.

15. The manufacturing method of the memory structure according to claim 14, wherein the etch-back process comprises a dry etching process or a wet etching process.

16. The manufacturing method of the memory structure according to claim 9, further comprising:
performing a pull back process to the spacer.

17. The manufacturing method of the memory structure according to claim 16, wherein the pull back process comprises a dry etching process or a wet etching process.

18. The manufacturing method of the memory structure according to claim 9, further comprising:
forming a second gate on the substrate in the memory cell region, wherein the charge storage layer and the second gate are formed of the same material layer; and
forming a third dielectric layer between the second gate and the substrate.

* * * * *